(12) United States Patent
Sugo et al.

(10) Patent No.: US 8,487,062 B2
(45) Date of Patent: Jul. 16, 2013

(54) POLYIMIDESILICONE HAVING ALCOHOLIC HYDROXYL GROUP AND PROCESS FOR PRODUCING THE SAME

(75) Inventors: Michihiro Sugo, Annaka (JP); Shohei Tagami, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 203 days.

(21) Appl. No.: 12/893,784

(22) Filed: Sep. 29, 2010

(65) Prior Publication Data
US 2011/0077374 A1 Mar. 31, 2011

(30) Foreign Application Priority Data
Sep. 30, 2009 (JP) ................. P2009-227159

(51) Int. Cl.
*C08G 77/04* (2006.01)
(52) U.S. Cl.
USPC ........................................................... 528/41
(58) Field of Classification Search
USPC ........................................... 528/41, 21
See application file for complete search history.

(56) References Cited

U.S. PATENT DOCUMENTS

| | | | |
|---|---|---|---|
| 5,677,393 A | 10/1997 | Ohmori et al. | |
| 2004/0019174 A1 | 1/2004 | Ichiroku et al. | |
| 2006/0069227 A1 | 3/2006 | Sugo et al. | |
| 2006/0079658 A1 | 4/2006 | Kato et al. | |
| 2007/0197680 A1 | 8/2007 | Sugo et al. | |
| 2010/0233619 A1 | 9/2010 | Tagami et al. | |

FOREIGN PATENT DOCUMENTS

| | | | |
|---|---|---|---|
| EP | 1 642 919 A1 | 4/2006 | |
| EP | 1 842 870 A2 | 10/2007 | |
| EP | 2 228 400 A1 | 9/2010 | |
| JP | 6-200216 A | 7/1994 | |
| JP | 2001-335619 A | 12/2001 | |
| JP | 3329677 B2 | 9/2002 | |
| JP | 2004-51794 A | 2/2004 | |
| JP | 2006-131892 A | 5/2006 | |
| JP | 2006-133757 A | 5/2006 | |
| JP | 2007-217490 A | 8/2007 | |
| JP | 2009-20246 A | 1/2009 | |

OTHER PUBLICATIONS

European Search Report issued Dec. 6, 2010 in EP 10251711.7.*

\* cited by examiner

*Primary Examiner* — Kuo-Liang Peng
(74) *Attorney, Agent, or Firm* — Birch, Stewart, Kolasch & Birch, LLP

(57) ABSTRACT

The present invention provides a polyimidesilicone having a primary alcoholic hydroxyl group, which is represented by the following general formula (1):

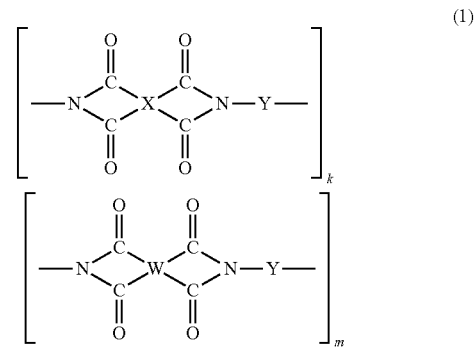

in which k and m are each a positive integer where k and m satisfy a relation of $0.01 \leq k/(k+m) < 1$; and X, Y and W are as those defined in the specification.

7 Claims, 2 Drawing Sheets

POLYIMIDESILICONE HAVING ALCOHOLIC HYDROXYL GROUP AND PROCESS FOR PRODUCING THE SAME

FIELD OF THE INVENTION

The present invention relates to a novel polyimide having a primary hydroxyl group, which is suitable for protective insulation films for semiconductor devices, insulation films for multilayer printed circuit boards, solder protective films, cover lay films, and the like owing to its thermal resistance, chemical resistance, insulation performance, and flexibility; and to a process for producing the polyimide.

BACKGROUND OF THE INVENTION

Hitherto, polyimides having a phenolic hydroxyl group have been variously investigated and proposed (see, Patent Documents 1, 2, 3, and 4). Moreover, a polyimide having an epoxy group or an unsaturated hydrocarbon group and a secondary alcoholic hydroxyl group has been also proposed (see, Patent Document 5). Furthermore, a polyimide having a primary alcoholic hydroxyl group rich in reactivity has been proposed (see, Patent Document 6).
- Patent Document 1: JP-A-6-200216
- Patent Document 2: Japanese Patent No. 3329677
- Patent Document 3: JP-A-2004-51794
- Patent Document 4: JP-A-2007-217490
- Patent Document 5: JP-A-2001-335619
- Patent Document 6: JP-A-2006-131892

SUMMARY OF THE INVENTION

However, a polyimidesilicone having a primary alcoholic hydroxyl group rich in reactivity, which uses an acid anhydride-modified silicone, has not yet been developed.

The present invention has been accomplished in consideration of the above situations and provides a novel polyimidesilicone having a primary alcoholic hydroxyl group, which uses an acid anhydride-modified silicone, and a process for producing the polyimidesilicone.

Namely, the present invention provides the following items 1 to 8.

1. A polyimidesilicone having a primary alcoholic hydroxyl group, which is represented by the following general formula (1):

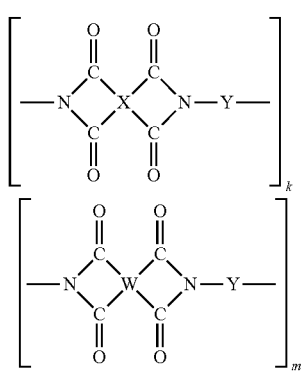

wherein
k and m are each a positive integer, in which k and m satisfy a relation of $0.01 \leq k/(k+m) < 1$;

X is a tetravalent organic group represented by the following general formula (2):

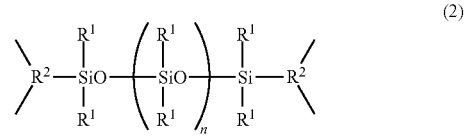

wherein $R^1$'s are each independently a monovalent hydrocarbon group having 1 to 8 carbon atoms, $R^2$'s are each independently a trivalent organic group, and n is a numeral of 1 to 120 in average;

Y's are each a divalent organic group and at least a part thereof is represented by the following general formula (3):

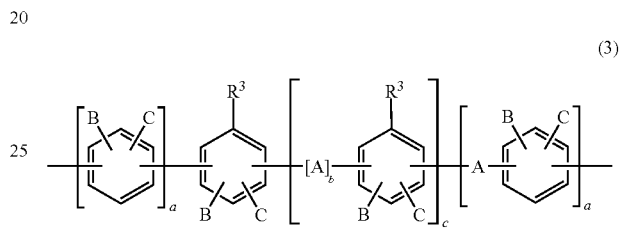

wherein A('s) is/are each a divalent organic group selected from:

—$CH_2$—, —O—, —$SO_2$—, —CONH—,

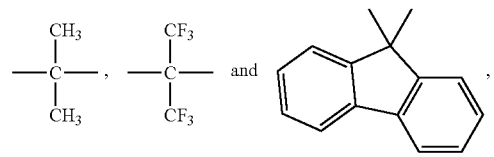

which may be the same or different from each other, B('s) and C('s) are each an alkyl group having 1 to 4 carbon atoms or a hydrogen atom, which may be the same or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one of $R^3$'s is an organic group containing a primary alcoholic hydroxyl group; and W is a tetravalent organic group other than X.

2. The polyimidesilicone according to item 1, which is a polyimidesilicone represented by the following general formula (1-1):

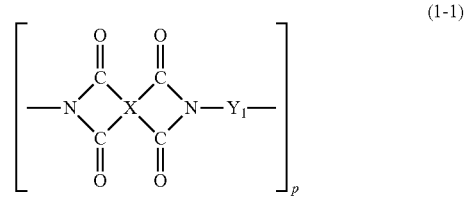

-continued

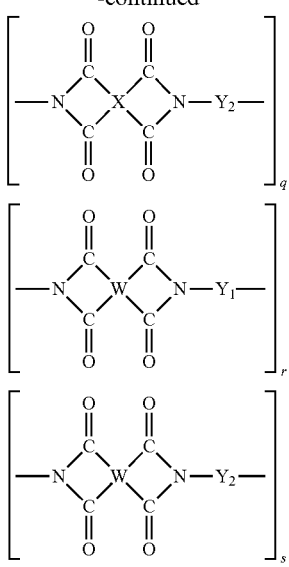

wherein

X and W are the same as above;

$Y_1$'s are each a divalent organic group represented by the general formula (3) and $Y_2$'s are each a divalent organic group other than the group represented by the general formula (3); and p and r are each a positive integer, and q and s are each 0 or a positive integer, in which p, q, r and s satisfy relations of p+q=k and r+s=m (wherein k and m are the same as above).

3. The polyimidesilicone according to item 1, wherein in the general formula (3), at least one of $R^3$'s is a monovalent group selected from —OH, —OCH$_2$CH(OH)CH$_2$OH and —OCH(CH$_2$OH)CH$_2$OH.

4. The polyimidesilicone according to item 1, wherein in the general formula (1), W is at least one of tetravalent organic groups represented by the following formulae:

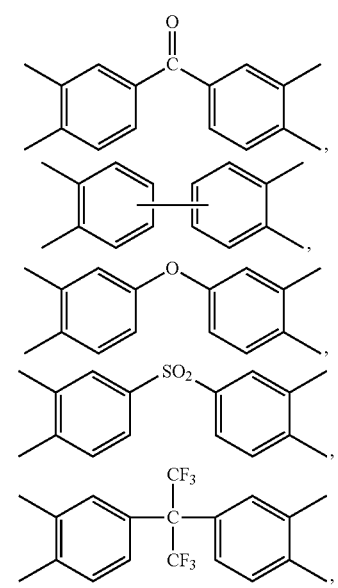

-continued

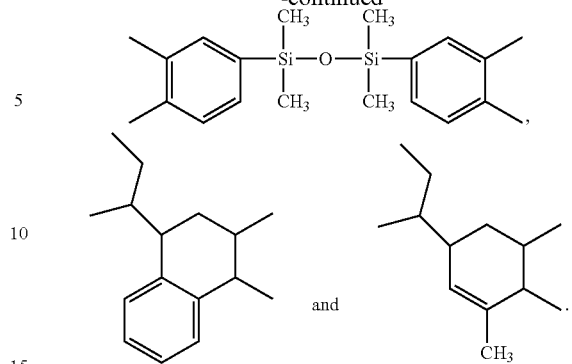

5. The polyimidesilicone according to item 1, which has an OH value of 20 to 200 KOH mg/g.

6. The polyimidesilicone according to item 2, wherein $Y_2$'s are at least one selected from a divalent organic group represented by the following general formula (4):

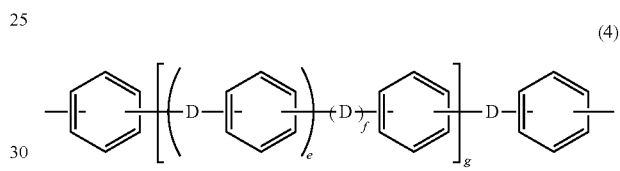

wherein D('s) is/are each independently any of the following divalent organic groups:

—CH$_2$—, —O—, —SO$_2$—, —CONH—,

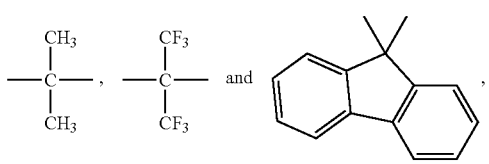

and e and f are each independently 0 or 1 and g is 0 or 1; and a divalent organic group renresented by the following general formula (5)

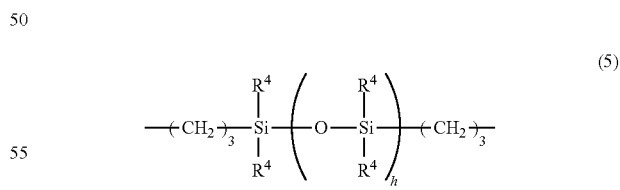

wherein $R^4$'s are each independently a monovalent hydrocarbon group having 1 to 8 carbon atoms and h is an integer of 1 to 80.

7. The polyimidesilicone according to item 1, which has a phenol group, a thiol group or a carboxyl group at a terminal end thereof.

8. A process for producing a polyimidesilicone having a primary alcoholic hydroxyl group, which is represented by the following general formula (1):

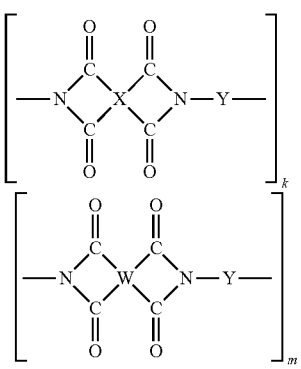

(1)

wherein
k and m are each a positive integer, in which k and m satisfy a relation of $0.01 \leq k/(k+m) < 1$,
X is a tetravalent organic group represented by the following general formula (2):

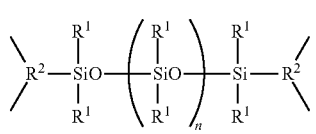

(2)

wherein $R^1$'s are each independently a monovalent hydrocarbon group having 1 to 8 carbon atoms, $R^2$'s are each independently a trivalent organic group, and n is a numeral of 1 to 120 in average,
Y's each are a divalent organic group and at least a part thereof is represented by the following general formula (3):

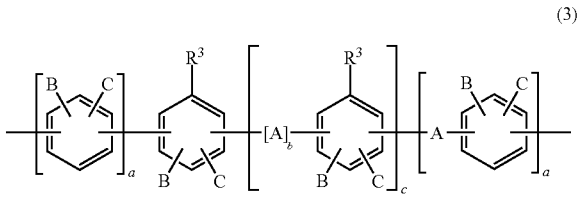

(3)

wherein A('s) is/are each a divalent organic group selected from the following groups:
—$CH_2$—, —O—, —$SO_2$—, —CONH—,

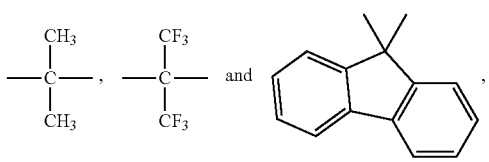

which may be the same or different from each other, B('s) and C('s) are each an alkyl group having 1 to 4 carbon atoms or a hydrogen atom, which may be the same or different from each other, a is 0 or 1, b is 0 or 1, c is an integer of 0 to 10, and $R^3$('s) is/axe each a monovelent group selected from organic groups containing a phenolic hydroxyl group or an alcoholic hydroxyl group, in which at least one of $R^3$'s is an organic group containing a primary alcoholic hydroxyl group, and
W is a tetravalent organic group other than X,
the method comprising:
reacting an diamine having a phenolic hydroxyl group with an acid anhydride-modified silicone, an acid dianhydride, and, if necessary, an diamine having no phenolic hydroxyl group and no carboxyl group to obtain a polyamic acid;
then subjecting the polyamic acid to a dehydrative ring-closure reaction to obtain a polyimide having a phenolic hydroxyl group represented by the following general formula (6):

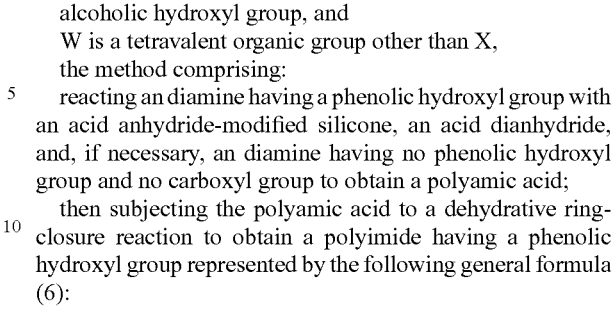

(6)

wherein
X, W, k, and m are the same as above; and
Z's each are a divalent organic group and at least a part thereof is a divalent organic group represented by the following general formula (7):

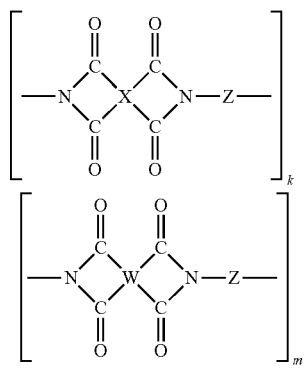

(7)

wherein A('s) is/are each a divalent organic group selected from the following groups:
—$CH_2$—, —O—, —$SO_2$—, —CONH—,

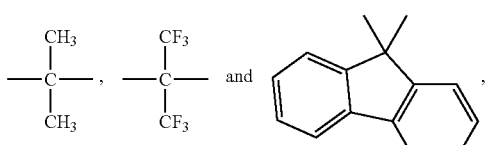

which may be the same or different from each other, B('s) and C('s) are each an alkyl group having 1 to 4 carbon atoms or a hydrogen atom, which may be the same or different from each other, a is 0 or 1, b is 0 or 1, and c is an integer of 0 to 10; and
subsequently subjecting the polyimide to a reaction with glycidol, and further optionally to a reaction with an acid anhydride.

The polyimidesilicone of the present invention is excellent in reactivity and is also excellent in adhesiveness to a substrate and chemical resistance. In addition, the polyimidesilicone affords a cured product having flexibility and low-stress property. Therefore, the polyimidesilicone of the present invention is appropriately used as a protective film for electric and electronic parts, semiconductor devices, and the like.

DETAILED DESCRIPTION OF THE INVENTION

Figure 1:
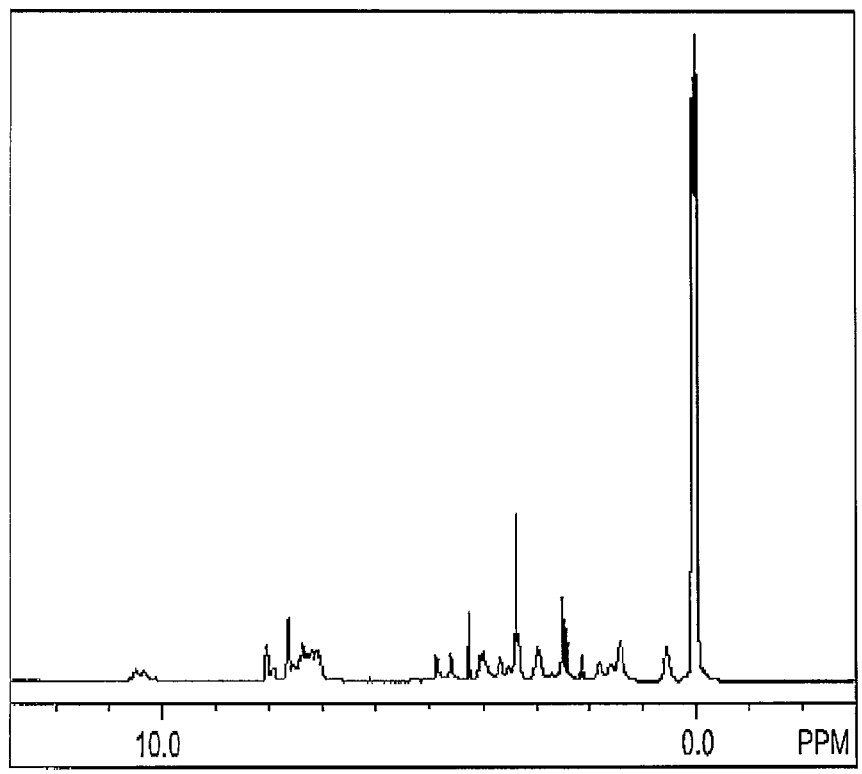
FIG. 1 is a $^1$H-NMR chart of Example 1.

The polyimidesilicone of the present invention is represented by the following general formula (1).

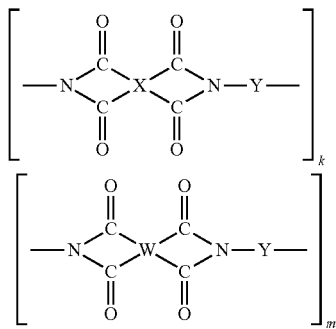

In the polyimidesilicone of the invention, X has a structure represented by the following formula (2). The polyimidesilicone of the invention is made flexible by incorporating this unit.

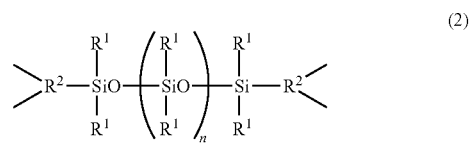

In the formula (2), $R^1$'s are each independently a monovalent hydrocarbon group having 1 to 8 carbon atoms, and examples thereof include alkyl groups such as a methyl group, an ethyl group, a propyl group, a butyl group, a pentyl group, and a hexyl group; cycloalkyl groups such as a cyclopentyl group and a cyclohexyl group; aryl groups such as a phenyl group; aralkyl groups such as a benzyl group and a phenethyl group; and alkenyl groups such as a vinyl group, an allyl group, a propenyl group, an isopropenyl group, and a butenyl group. From the viewpoint of easy availability of raw materials, a methyl group, an ethyl group, a phenyl group, and a vinyl group are preferred.

In the formula (2), $R^2$'s are each independently a trivalent organic group, preferably a trivalent organic group having a carbon number of 2 to 10. Examples thereof include residual groups which may be formed by removing a carboxyl group or a carboxyl anhydride group from alkylsuccinic anhydrides such as propylsuccinic anhydride; norbornenedicarboxylic acid anhydride; propylnadic anhydride; and phthalic anhydride. Preferred are residual groups from norbornylic anhydride and propylsuccinic anhydride. Moreover, in the formula (2), n is an integer of 1 to 120, preferably 3 to 80, and further preferably 5 to 50.

As X, the following structures may be mentioned.

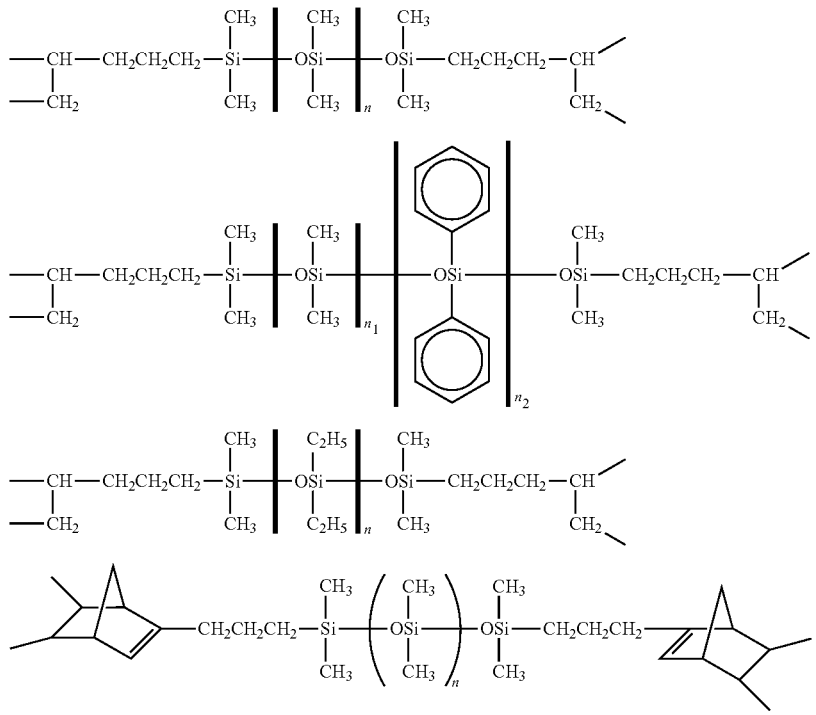

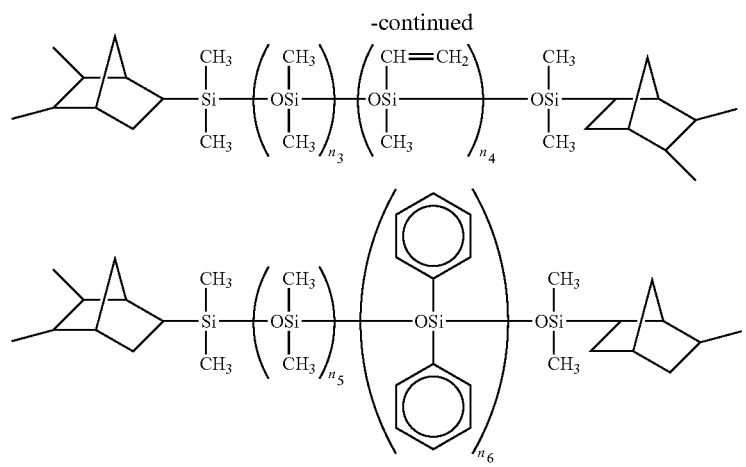
In the above structures, $n_1$ and $n_2$ are each an integer of 0 or 1 or more and satisfy a relation of $n_1+n_2=n$. Moreover, $n_3$ and $n_4$ are each an integer of 0 or 1 or more and satisfy a relation of $n_3+n_4=n$. Furthermore, $n_5$ and $n_6$ are each an integer of 0 or 1 or more and satisfy a relation of $n_5+n_6=n$.
As X, more specifically, the following structures may be mentioned.
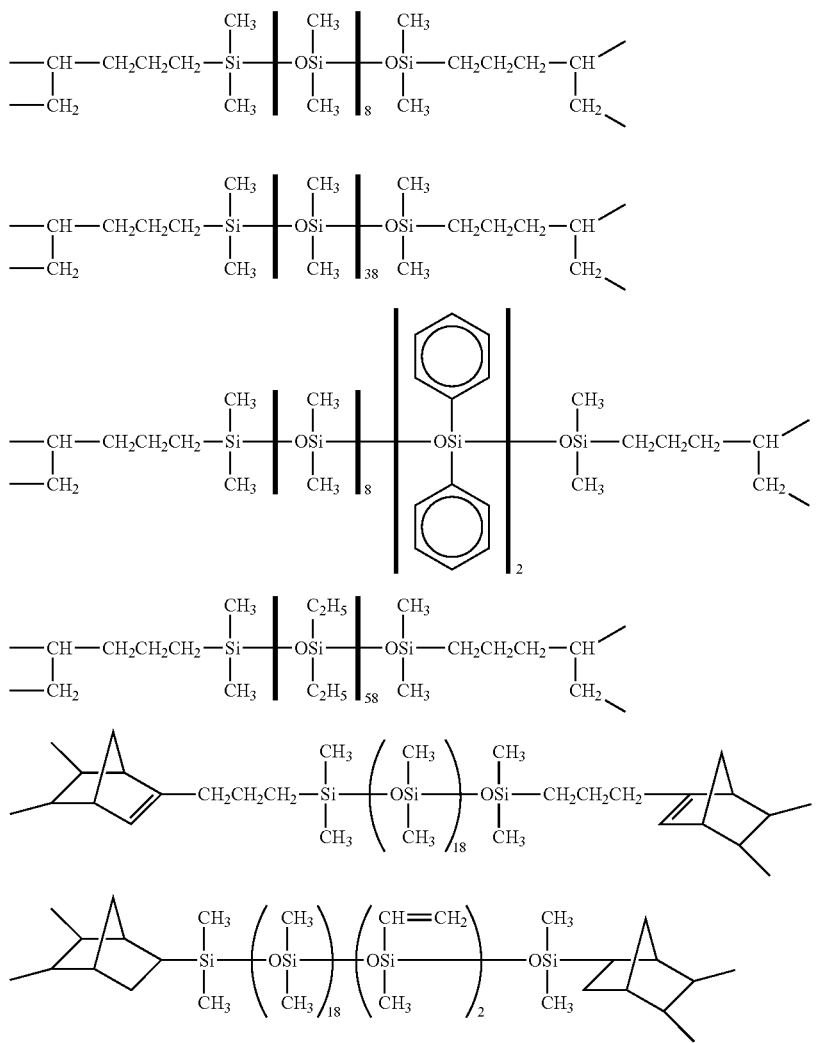

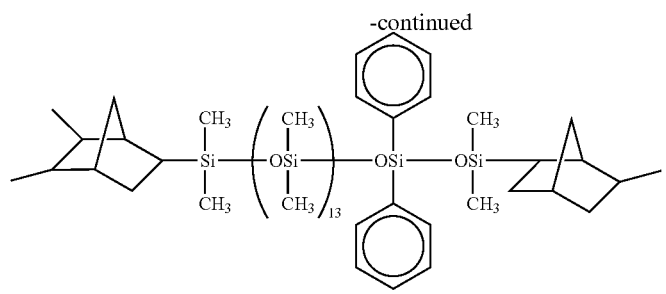

The above-mentioned X can be derived from a modified silicone obtained by reacting the above-mentioned acid anhydride having an unsaturated group such as succinic anhydride, norbornenedicarboxylic acid anhydride, propylnadic anhydride, or phthalic anhydride with an organohydrogen polysiloxane. Depending on the distribution of the number of siloxane units in the organohydrogen polysiloxane, the number of siloxane units of the resulting acid anhydride-modified polysiloxane is also distributed. Therefore, n in the formula (2) represents an average value thereof.

Y's in the general formula (1) are each a divalent organic group having a primary alcoholic hydroxyl group and at least a part thereof is represented by the general formula (3).

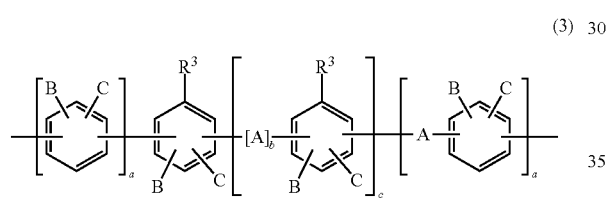

(3)

In the formula (3), A('s) is/are each independently selected from the following divalent organic groups:
—CH$_2$—, —O—, —SO$_2$—, —CONH—,

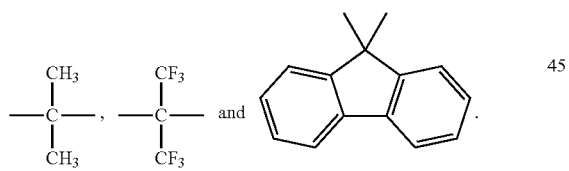

In the formula (3), a is 0 or 1, b is 0 or 1, and c is an integer of 0 to 10 and c is preferably an integer of 1 to 10.

In the formula (3), B('s) and C('s) are each an alkyl group having 1 to 4 carbon atoms or a hydrogen atom and may be the same or different from each other. Examples thereof include a methyl group, an ethyl group, a propyl group a butyl group and a hydrogen atom. Of these, a methyl group and a hydrogen atom are preferred from the viewpoint of easy availability of raw materials.

In the above formula (3), R$^3$('s) is/are each a monovelent group selected from an organic group containing a phenolic hydroxyl group or an alcoholic hydroxyl group and at least one of R$^3$'s is an organic group containing a primary alcoholic hydroxyl group. Specifically, there may be mentioned —OH, —OCH$_2$CH(OH)CH$_2$OH, and —OCH(CH$_2$OH)CH$_2$OH.

As the group represented by the formula (3), the following groups may be mentioned.

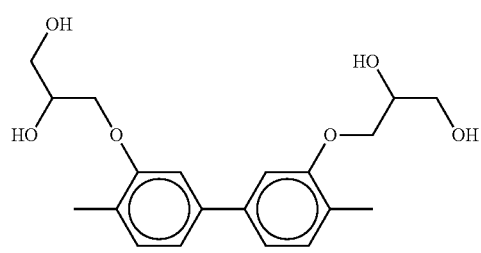

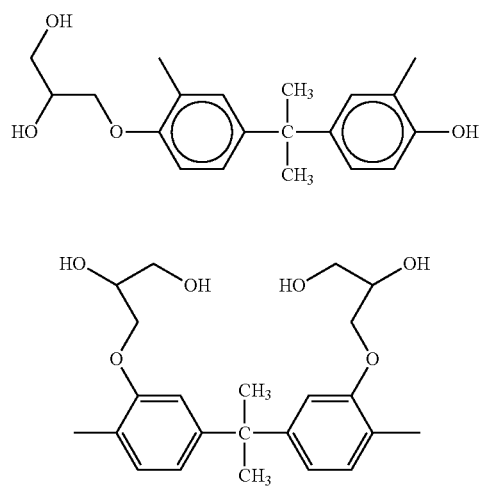

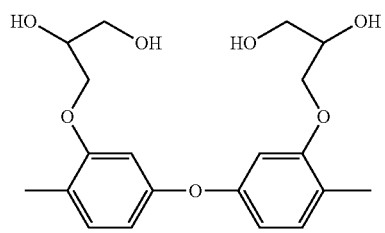

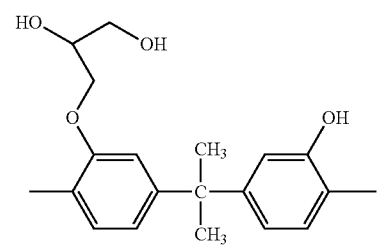

-continued

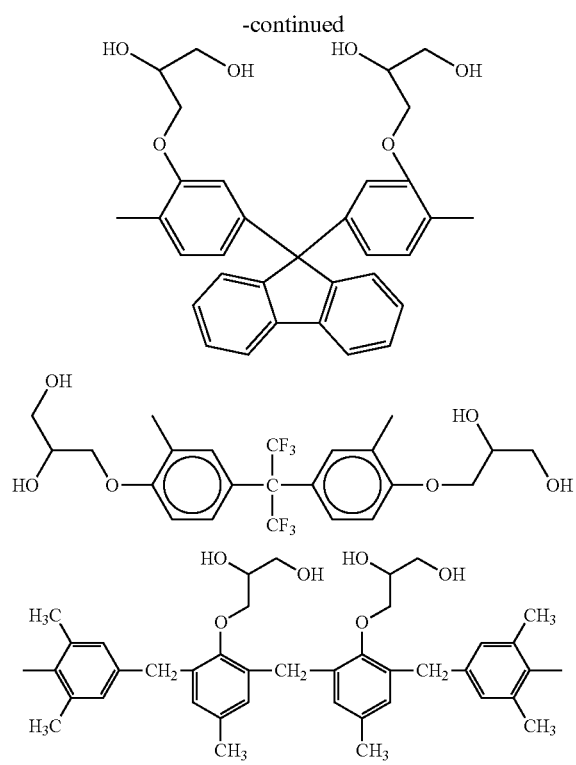

Another part of Y's may be a divalent organic group other than the group represented by the above general formula (3). That is, the polyimidesilicone of the invention is preferably a polyimidesilicone represented by the general formula (1-1).

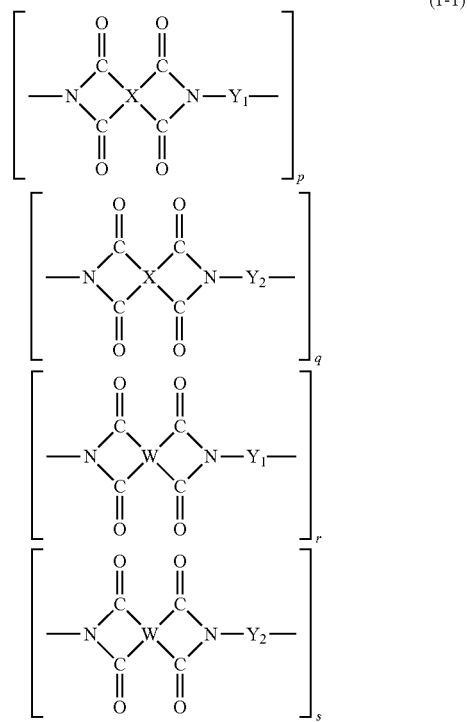

In the formula (1-1), X and W are the same as above.

$Y_1$'s are each a divalent organic group represented by the above general formula (3) and $Y_2$'s are each a divalent organic group other than the group represented by the above general formula (3).

p and r are each a positive integer, and q and s are each 0 or a positive integer, in which p, q, r and s satisfy relations of p+q=k and r+s=m (k and m are the same as above).

$Y_2$'s are each a divalent organic group other than the group represented by the above general formula (3), i.e., a divalent organic group having no primary alcoholic hydroxyl group. Specifically, it is preferably at least one selected from a divalent organic group represented by the following formula (4) and a divalent organic group represented by the following general formula (5).

The formula (4) is as follows.

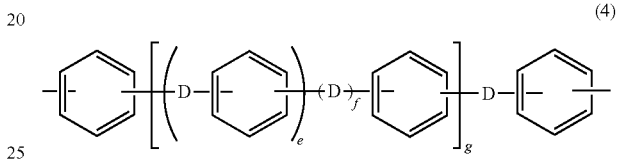

In the above formula, D('s) is/are each independently a divalent organic group which is the same as A defined above. In addition, e and f are each independently 0 or 1 and g is 0 or 1.

As the formula (4), the following groups may be mentioned.

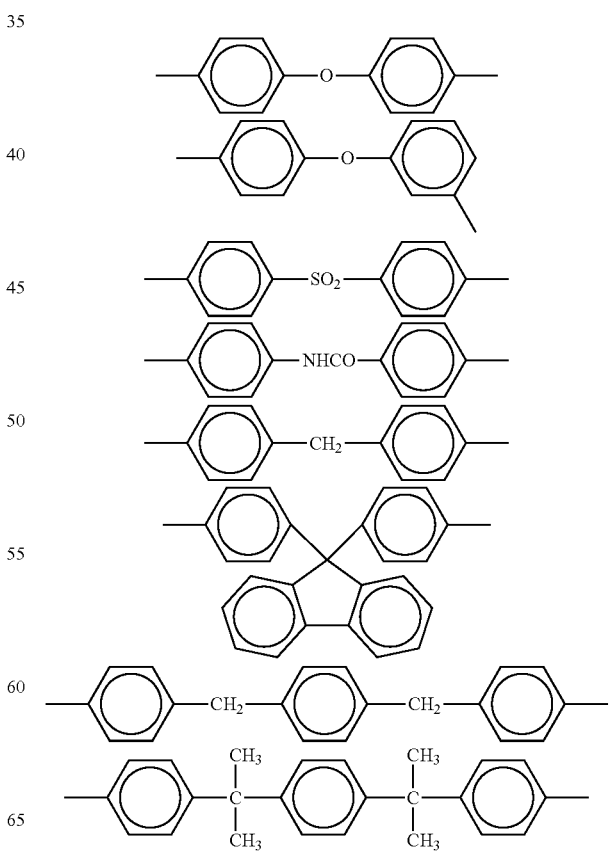

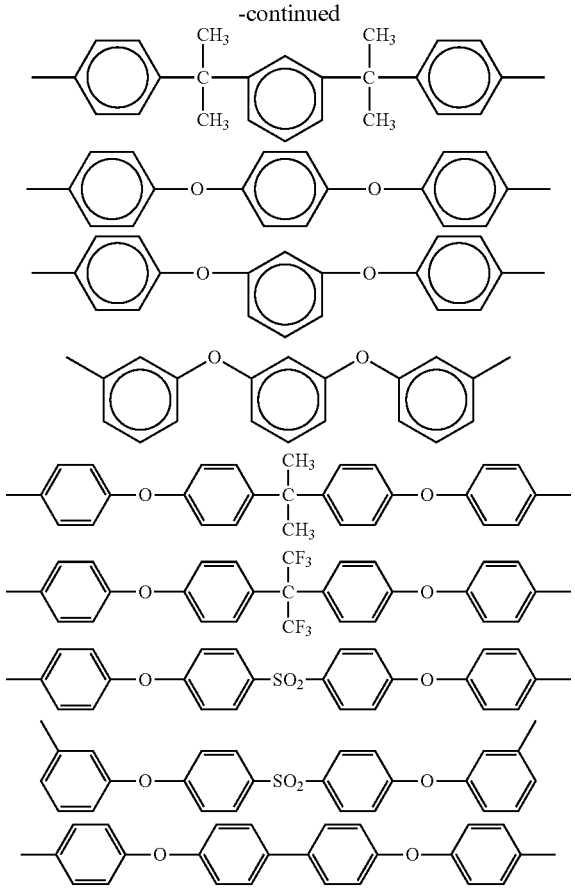

The formula (5) is as follows.

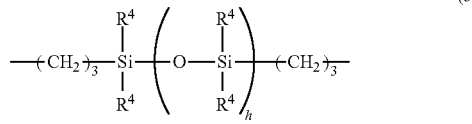
(5)

In the formula (5), $R^4$'s are each independently a monovalent hydrocarbon group having 1 to 8 carbon atoms, and examples thereof include a methyl group, an ethyl group, a propyl group, a butyl group, a hexyl group, a cyclohexyl group, and a phenyl group. Of these, from the viewpoint of availability of raw materials, a methyl group and a phenyl group are particularly preferred.

In the formula (5), h is an integer of 1 to 80, preferably an integer of 1 to 20.

In the formula (1), W may be any of known various groups as long as it is a tetravalent organic group other than the above X and there may be exemplified the following groups.

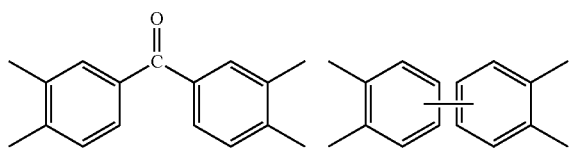

The polyimidesilicone having the above each structure has a molecular weight (number average molecular weight) of preferably 5,000 to 200,000, particularly preferably 8,000 to 100,000. When the molecular weight thereof is too small, strength of the film obtained from the polyimidesilicone resin sometimes becomes low. On the other hand, when the molecular weight thereof is too large, the polyimidesilicone resin has a poor compatibility to a solvent and handling ability decreases in some oases.

Furthermore, the number k of repeating units containing X is a positive integer and is preferably 1 to 500, more preferably 3 to 300. The number m of repeating units containing W is a positive integer and is preferably 1 to 500, more preferably 3 to 300.

Moreover, the ratio of k, i.e., k/(k+m) satisfies a relation of $0.01 \leq k/(k+m) < 1$. Preferably, the ratio is 0.1 or more and less than 1, more preferably 0.2 or more and 0.95 or less, and particularly preferably 0.5 or more and 0.9 or less. When the ratio is leas than 0.01, it is difficult to attain a sufficient flexibility.

The polyimidesilicone of the invention preferably has an OH value in accordance with JIS K0070 of 20 to 200 KOH mg/g, particularly 30 to 150 KOH mg/g. When the OH value falls within the range, in the case where the polyimidesilicone is applied to the applications to be mentioned later, one having a particularly excellent property is obtained.

In order to produce the polyimidesilicone of the invention, a diamine having a phenolic hydroxyl group, an acid anhydride-modified silicone, an acid dianhydride, and, if necessary, a diamine having no phenolic hydroxyl group and no carboxyl group are first reacted to obtain a polyamic acid.

Examples of the diamine having a phenolic hydroxyl group include diamines having a phenol group, such as 3,3'-diamino-4,4'-dihydroxybiphenyl, 2,2'-diamino-4,4'-dihydroxybiphenyl, 2,2-bis(4-amino-3-hydroxyphenyl)propane, 2,2-bis(3-amino-4-hydroxyphenyl)propane, 9,9-bis(3-amino-4-hydroxyphenyl)fluorene, 2,2'-methylenebis[6-(4-amino-3,5-dimethylbenzyl)-4-methyl]phenol, 3,3'-diamino- 4,4'-dihydroxydiphenyl ether, and 2,2-bis(3-amino-4-hydroxyphenyl)hexafluoropropane.

As the acid anhydride-modified silicone, for example, the following compounds are mentioned.

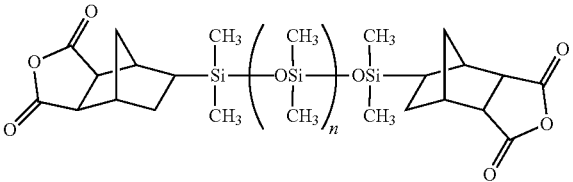

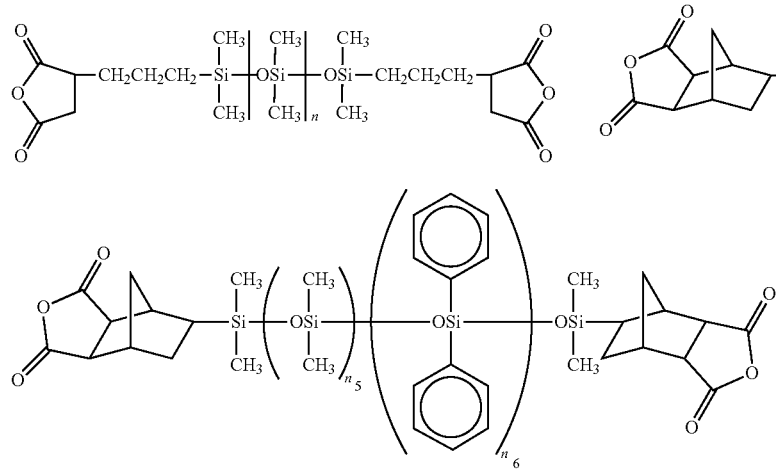

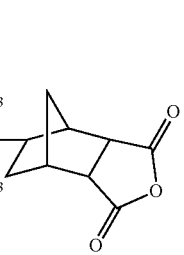

In the above-formulae, n is an integer of 1 to 120, preferably an integer of 3 to 80, and further preferably an integer of 5 to 50. In addition, $n_5$ and $n_6$ are each integer of 0 or 1 or more and satisfies a relation of $n_5+n_6=n$.

Examples of the acid dianhydride for use in the polymerization for the polyamic acid include 3,3',4,4'-diphenylsulfonetetracarboxylic dianhydride, 3,3',4,4'-biphenyltetraearboxylic dianhydride, 2,3',3,4'-biphenyltetracarboxylic dianhydride, 5-(2,5-dioxotetrahydro-3-furanyl)-3-methyl-3-cyclohexene-1,2-dicarboxylic anhydride, 4-(2,5-dioxotetrahydrofuran-3-yl)-1,2,3,4-tetrahydronaphthalene-1,2-dicarboxylic anhydride, 1,2,3,4-butanetetracarboxylic dianhydride, 3,3',4,4'-benzophenonetetracarboxylic dianhydride, 4,4'-hexafluoropropylidenebisphthalic dianhydride, 2,2-bis(p-trimethoxyphenyl)propane, 1,3-tetramethyldisiloxanebisphthalic dianhydride, and 4,4'-oxydiphthalic dianhydride, Examples of the diamine having no phenolic hydroxyl group and no carboxyl group include 4,4'-diaminobenzanilide, 4,4'-diaminodiphenyl ether, 3,4'-diaminodiphenyl ether, 4,4'-diaminodiphenyl sulfone, 3,3-dimethyl-4,4'-diaminobiphenyl, 4,4'-(p-phenylenediisopropylidene)dianiline, phenylenediisopropylidene)dianiline, 1,3-bis(4-aminophenoxy)benzene, 1,4-bis(4-aminophenoxy)benzene, 1,3-bis(3-aminophenoxy)benzene, 2,2-bis[4-(4-amniophenoxy)phenyl]propane, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, and 9,9-bis(4-aminophenyl)fluorene.

In the synthesis of the polyamic acid, the ratio of the diamine component to the acid dianhydride component is appropriately determined depending on the adjustment of the molecular weight of the polyimide and the like and is usually in the range of 0.95 to 1.05, preferably 0.98 to 1.02 as a molar ratio. In this regard, in order to introduce a reactive functional group at the polyimidesilicone terminal end, an amino alcohol, an amino thiol, a functional acid anhydride such as trimellitic acid anhydride, and an amine compound can be added. The amount thereof to be added in this case is preferably 20% by mol or less based on the acid dianhydride component or the diamine component.

The reaction of the diamine with the acid dianhydride is usually carried out in a solvent. Such a solvent may be one which dissolves polyimide. Specific examples of the solvent include ethers such as tetrahydrofuran and anisole; ketones such as cyclohexanone, 2-butanone, methyl isobutyl ketone, 2-heptanone, 2-octanone, and acetophenone; esters such as butyl acetate, methyl benzoate, and γ-butyrolactone; cellosolves such as butyl cellosolve acetate and propylene glycol monomethyl ether acetate; amides such as N,N-dimethylformamide, N,N-dimethylacetamide, and N-methyl-2-pyrrolidone; and aromatic hydrocarbons such as toluene and xylene. The solvent is preferably a ketone, an ester, and a cellosolve, particularly preferably γ-butyrolactone, propylene glycol monomethyl ether acetate, N,N-dimethylacetamide, or N-methyl-2-pyrrolidone. One kind of these solvents may be used alone or two or more kinds thereof may be used in combination. Usually, in consideration of a yield per 1 batch, dissolution viscosity, and the like, the amount is adjusted so that concentration of the polyimide becomes 10 to 40% by weight.

Then, the above obtained polyamic acid is subjected to a dehydrative ring-closure reaction to obtain a polyimide having a phenolic hydroxyl group represented by the general formula (6), and the polyimide is subsequently subjected to a reaction with glycidol, and further, if necessary, to a reaction with an acid anhydride, whereby the polyimidesilicone of the invention can be obtained.

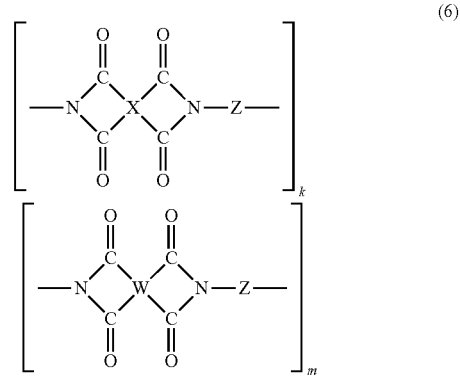

(6)

In the formula (6), X, W, k, and m are the same as above.

In addition, Z's are each a divalent organic group and at least a part thereof is a divalent organic group represented by the general formula (7).

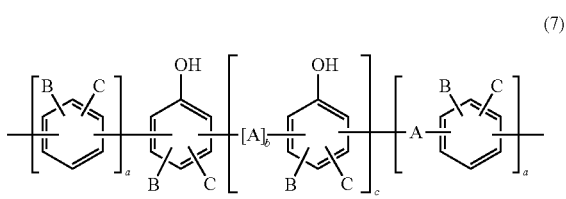

(7)

In the formula (7), A('s), B('s), C('s), a, b, and c are the same as above.

That is, for synthesis of the polyimide, the polyamic acid solution obtained in the above is heated to the temperature range of usually 80 to 200° C., preferably 140 to 180° C. or an acetic anhydride/pyridine mixed solution is added to the polyamic acid solution and the resulting solution is heated to about 50° C. to thereby allow the dehydrative ring-closure reaction to proceed at the acid amide part of the polyamic acid, whereby a polyimide can be obtained.

Glycidol is added in a necessary equivalent amount to the thus obtained organic solvent solution of the polyimide having a phenolic hydroxyl group in the molecule, which is represented by the above general formula (6), and the whole is heated. Accordingly, a polyimidesilicone having an alcoholic hydroxyl group represented by the above general formula (1) can be obtained. Although it is necessary to change the amount of glycidol to be charged depending on the amount of the alcoholic hydroxyl group to be introduced, usually, the amount thereof to be charged is preferably 0.3 to 3 molar equivalents to the phenolic hydroxyl group. The reaction temperature is 40° C. to 180° C., preferably 60 to 130° C. The reaction time is several minutes to 12 hours. Moreover, for the purpose of accelerating the reaction, a catalyst such as triethylamine may be added.

Furthermore, as the acid anhydride to be optionally reacted after the glycidol reaction, there may be mentioned phthalic anhydride, norbornenedicarboxylic acid anhydride, cyclohexyldicarboxylic acid anhydride, methylcyclohexyldicarboxylic acid anhydride, succinic anhydride, and the like.

With regard to the reaction of the acid anhydride, by adding the acid anhydride in the necessary equivalent amount and heating the whole, an objective polyimidesilicone having a carboxyl group and also having an alcoholic hydroxyl group can be obtained.

The thus obtained polyimidesilicone according to the invention is a novel polyimidesilicone mainly having a primary alcoholic hydroxyl group owing to reactivity and the like. Such a novel polyimidesilicone having a primary alcoholic hydroxyl group is useful for protective insulation films for semiconductor devices, insulation films for multilayer printed circuit boards, solder protective films, cover lay films, and the like, which are excellent in thermal resistance, chemical resistance, insulation performance, and flexibility.

EXAMPLES

The following will describe the invention in further detail with reference to Synthetic Examples, Examples, and Comparative Examples but the invention is not limited to the following examples.

Example 1

Into a flask fitted with a stirrer, a thermometer, and a nitrogen-substituting apparatus were charged 31.0 g (0.15 mol) of 4,4'-oxydiphthalic dianhydride 155.1 g (0.15 mol) of an acid anhydride-modified siloxane whose average structure is represented by the following formula (8), and 600 g of N-methyl-2-pyrrolidone. Then, 91.5 g (0.25 mol) of 2,2-bis(4-amino-3-hydroxyphenyl)hexafluoropropane was added to the flask with controlling so that the temperature of the reaction system did not exceed 50° C. Thereafter, the mixture was further stirred at room temperature for 10 hours. Next, after a reflux condenser with a water receiver was attached to the flask, 100 g of xylene was added and the whole was heated to 170° C. When the temperature was kept for 6 hours, a blown solution was obtained,

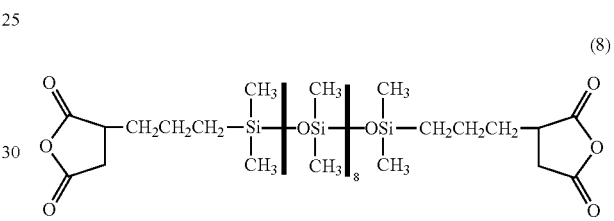

(8)

After the thus obtained blown solution was cooled to room temperature (25° C.), a polyimide solution having a phenolic hydroxyl group was obtained. Then, 23 g of glycidol was charged to the polyimide solution in a flask, followed by heating at 120° C. for 3 hours. After completion of the reaction, the solution was cooled to room temperature and the reaction solution was poured into methanol. Then, after the resulting precipitate was filtrated and dried, an objective polyimide having a primary alcoholic hydroxyl group was obtained. As a result of $^1$H-NMR (Lambda 300 manufactured by JEOL) analysis of the polymer, a peak at 10 ppm derived from the phenolic hydroxyl group decreased and peaks derived from primary and secondary alcoholic hydroxyl groups were observed at 4.6 ppm and 4.8 ppm, so that the polymer was found to be a polymer having a structure of repeating units represented by the following formula (see FIG. 1). As a result of gel permeation chromatography (GPC), number average molecular weight of the polymer was 39,000 and an OH value in accordance with JIS K0070 was 100 KOH mg/g.

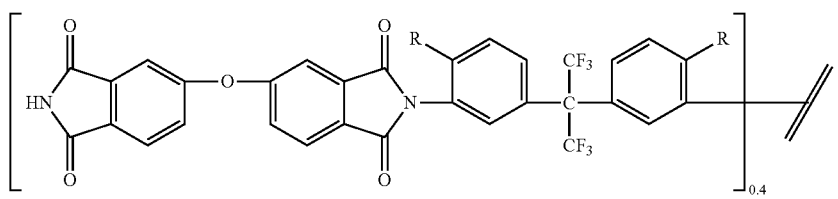

-continued

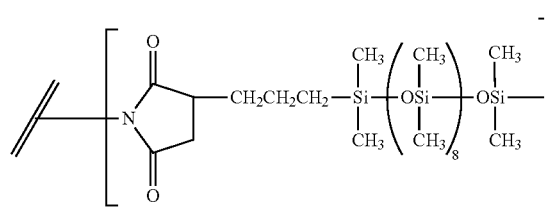
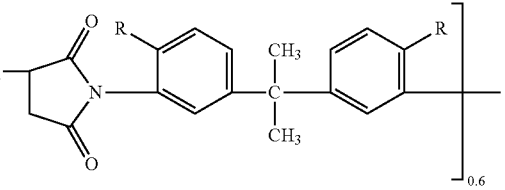

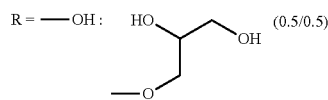

Example 2

Into a flask fitted with a stirrer, a thermometer, and a nitrogen-substituting apparatus were charged 55.5 g (0.125 mol) of 4,4'-hexafluoropropylidenebisphthalic dianhydride, 137.0 g (0.125 mol) of an acid anhydride-modified siloxane whose average structure was represented by the following formula (9), and 800 g of γ-butyrolactone. Then, 91.5 g (0.25 mol) of 2,2-bis(4-amino-3-hydroxyphenyl)hexafluoropropane was added into the flask with controlling so that the temperature of the reaction system did not exceed 50° C. Thereafter, the mixture was further stirred at room temperature for 10 hours. Next, after a reflux condenser with a water receiver was attached to the flask, 200 g of xylene was added and the whole was heated to 170° C. When the temperature was kept for 6 hours, a blown solution was obtained.

(9)

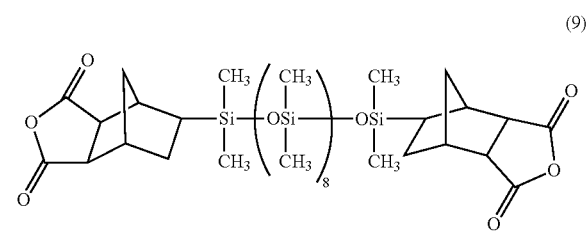

Figure 2:
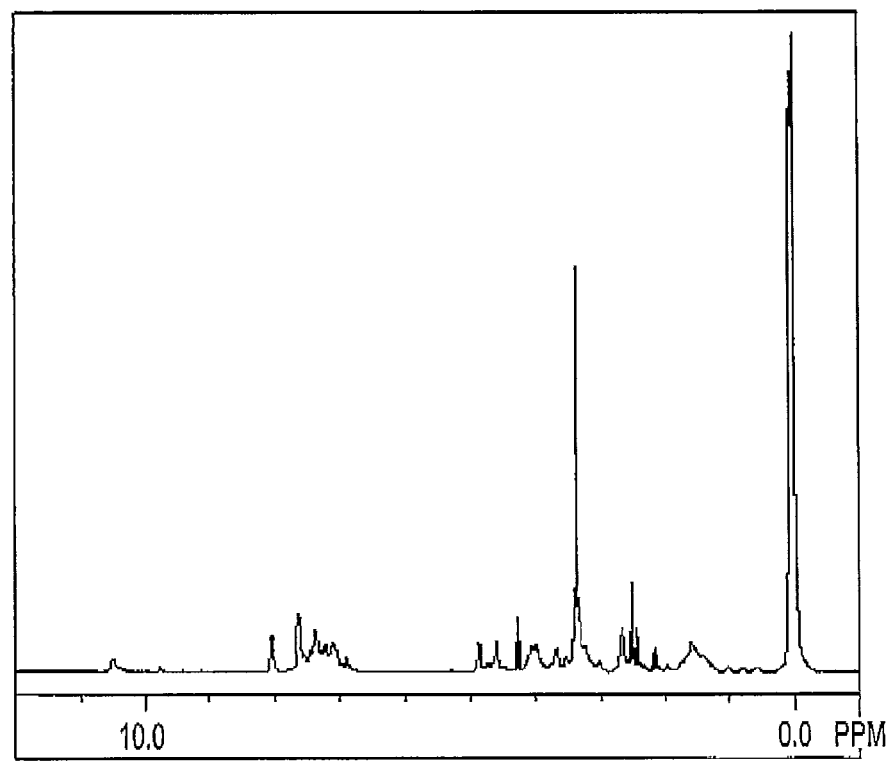
FIG. 2 is a $^1$H-NMR chart of Example 2.

After the thus obtained blown solution was cooled to room temperature (25° C.), a polyimide solution having a phenolic hydroxyl group was obtained. Then, 18.3 g of glycidol was charged to the polyimide solution in a flask, followed by heating at 120° C. for 3 hours. After completion of the reaction, the solution was cooled to room temperature and the reaction solution was poured into methanol. Then, after the resulting precipitate was filtrated and dried, an objective polyimide having a primary alcoholic hydroxyl group was obtained. As a result of $^1$H-NMR analysis of the polymer, a peak at 10 ppm derived from the phenolic hydroxyl group decreased and peaks derived from primary and secondary alcoholic hydroxyl groups were observed at 4.6 ppm and 4.8 ppm, so that the polymer was found to be a polymer having a structure of repeating units represented by the following formula (see FIG. 2). As a result of gel permeation chromatography (GPC), number average molecular weight of the polymer was 32,000 and an OH value in accordance with JIS K0070 was 100 KOH mg/g.

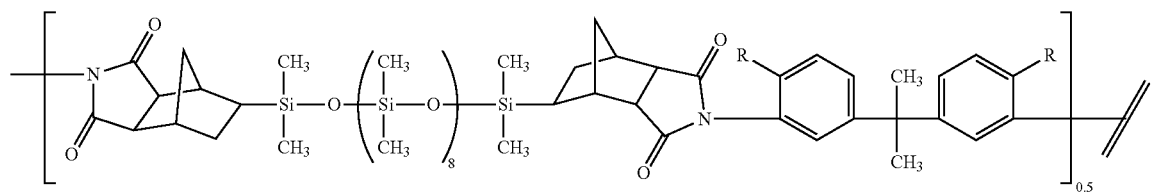

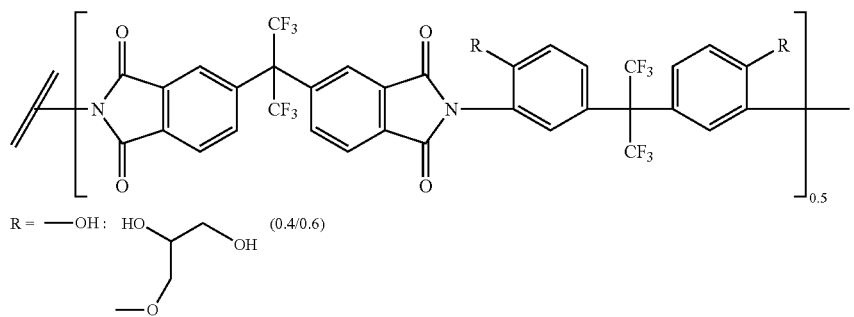

Example 3

Into a flask fitted with a stirrer, a thermometer, and a nitrogen-substituting apparatus were charged 31.0 g (0.1 mol) of 4,4'-oxydiphthalic dianhydride, 184.2 g (0.1 mol) of an acid anhydride-modified siloxane whose average structure is represented by the following formula (10), and 800 g of γ-butyrolactone. Then, 36.6 g (0.1 mol) of 2,2-bis(4-amino-3-hydroxyphenyl)hexafluoropropane and 23.4 g (0.08 mol) of 1,4-diaminophenoxybenzene were added to the flask with controlling so that the temperature of the reaction system did not exceed 50° C. Thereafter, 4.4 g (0.02 mol) of p-aminophenol was added and the mixture was further stirred at room temperature for 10 hours. Next, after a reflux condenser with a water receiver was attached to the flask, 200 g of xylene was added and the whole was heated to 170° C. When the temperature was kept for 6 hours, a blown solution was obtained.

Figure 3:
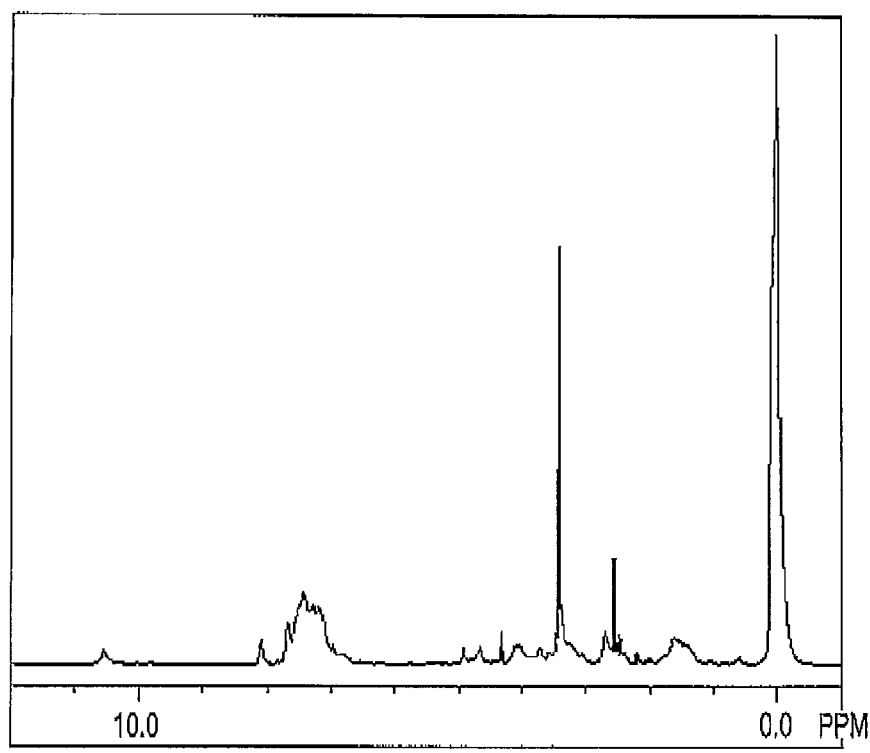
FIG. 3 is a $^1$H-NMR chart of Example 3.

After the thus obtained blown solution was cooled to room temperature (25° C.), a polyimide solution having a phenolic hydroxyl group was obtained. Then, 16.5 g of glycidol was charged to the polyimide solution in a flask, followed by heating at 120° C. for 3 hours. After completion of the reaction, the solution was cooled to room temperature and the reaction solution was poured into methanol. Then, after the resulting precipitate was filtrated and dried, an objective polyimide having a primary alcoholic hydroxyl group was obtained. As a result of $^1$H-NMR analysis of the polymer, a peak at 10 ppm derived from the phenolic hydroxyl group decreased and peaks derived from primary and secondary alcoholic hydroxyl groups were observed at 4.6 ppm and 4.8 ppm, so that the polymer was found to be a polymer having a structure of repeating units represented by the following formula (see FIG. 3). As a result of gel permeation chromatography (GPC), number average molecular weight of the polymer was 19,000 and an OH value in accordance with JIS K0070 was 39 KOH mg/g.

(10)

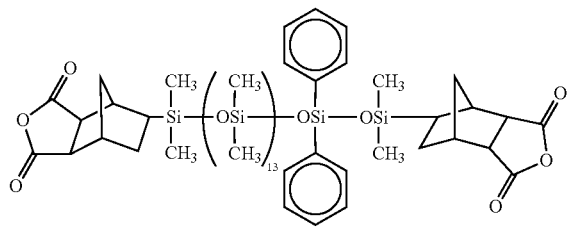

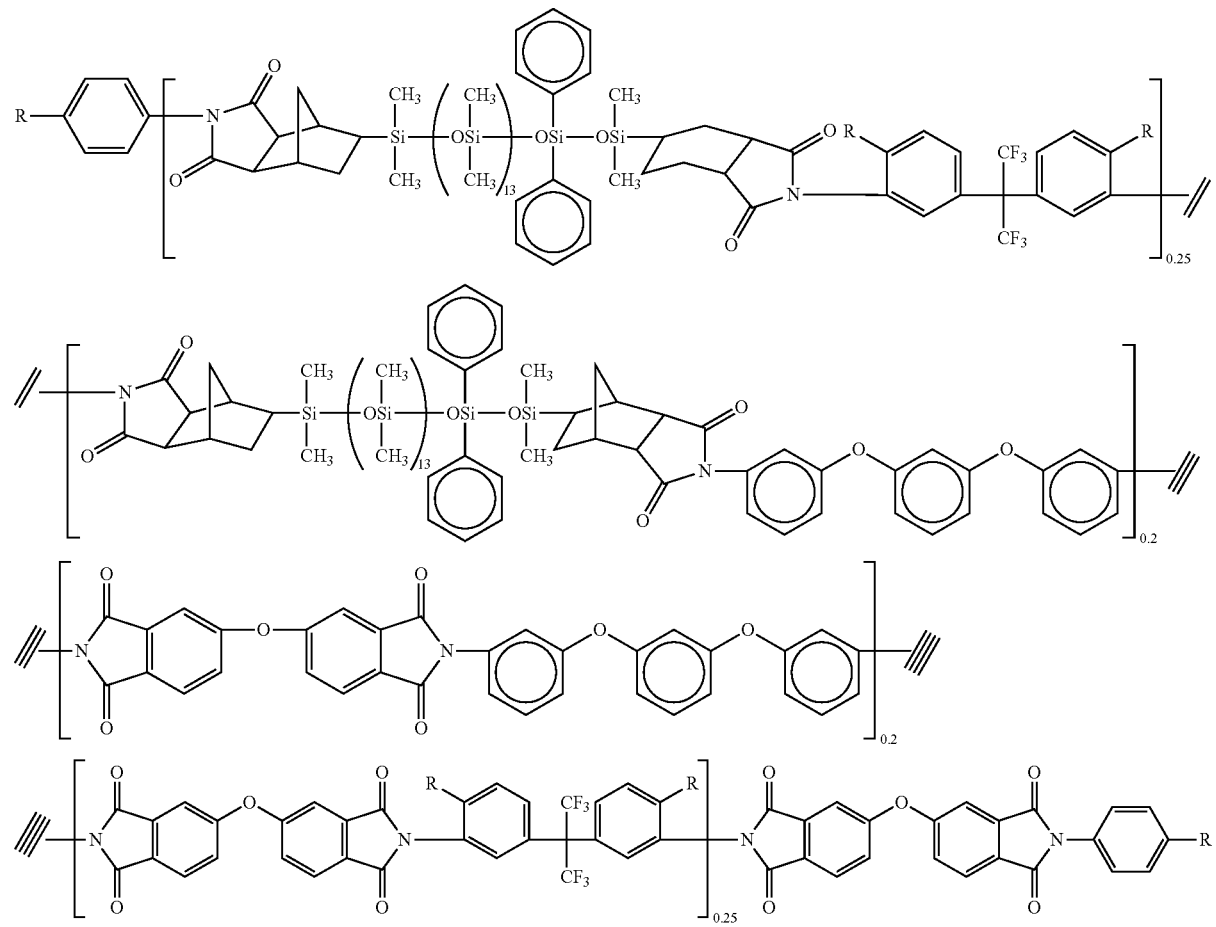

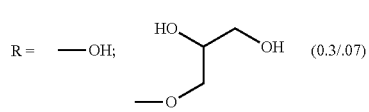 (0.3/.07)

Example 4

Into a flask fitted with a stirrer, a thermometer, and a nitrogen-substituting apparatus were charged 31.0 g (0.1 mol) of 4,4'-oxydiphthalic dianhydride, 164.4 g (0.15 mol) of an acid anhydride-modified siloxane whose average structure is represented by the following formula (9), which was the same as used in Example 2, and 800 g of γ-butyrolactone. Then, 45.2 g (0.175 mol) of 2,2-bis(4-amino-3-hydroxyphenyl) and 14.6 g (0.05 mol) of 1,4-diaminophenoxybenzene were added to the flask with controlling so that the temperature of the reaction system did not exceed 50° C. Thereafter, 5.5 g (0.025 mol) of p-aminophenol was added and the mixture was further stirred at room temperature for 10 hours. Next, after a reflux condenser with a water receiver was attached to the flask, 200 g of xylene was added and the whole was heated to 170° C. When the temperature was kept for 6 hours, a blown solution was obtained.

Figure 4:
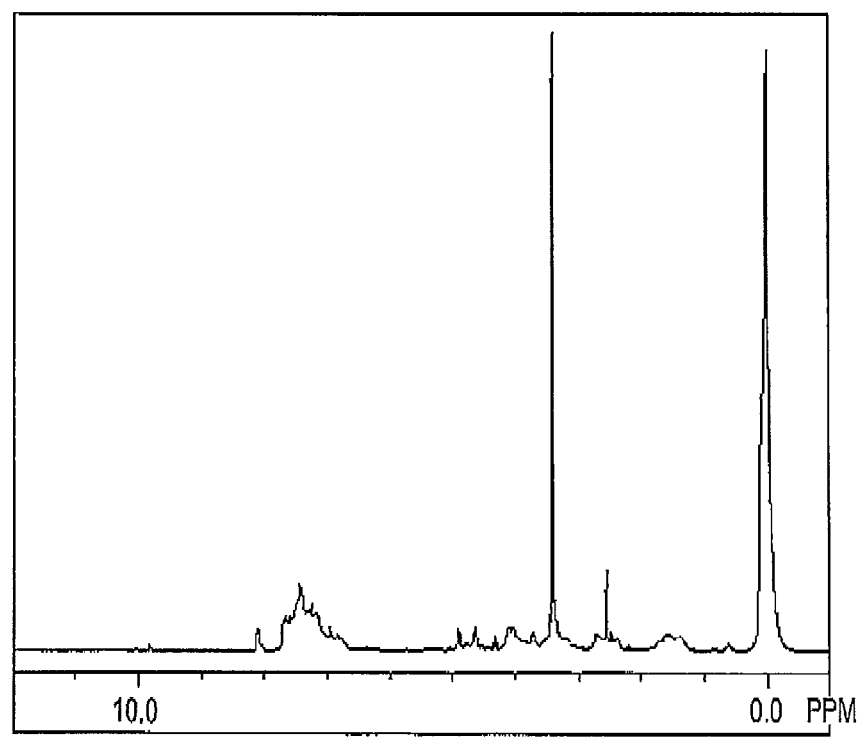
FIG. 4 is a $^1$H-NMR chart of Example 4.

After the thus obtained blown solution was cooled to room temperature (25° C.), a polyimide solution having a phenolic hydroxyl group was obtained. Then, 10.9 g of glycidol was charged to the polyimide solution in a flask, followed by heating at 120° C. for 3 hours. After completion of the reaction, the solution was cooled to room temperature and the reaction solution was poured into methanol. Then, after the resulting precipitate was filtrated and dried, an objective polyimide having a primary alcoholic hydroxyl group was obtained. As a result of $^1$H-NMR analysis of the polymer, a peak at 10 ppm derived from the phenolic hydroxyl group decreased and peaks derived from primary and secondary alcoholic hydroxyl groups were observed at 4.6 ppm and 4.8 ppm, so that the polymer was found to be a polymer having a structure of repeating units represented by the following formula (see FIG. 4). As a result of gel permeation chromatography (GPC), number average molecular weight of the polymer was 22,000 and an OH value in accordance with JIS K0070 was 51 KOH mg/g.

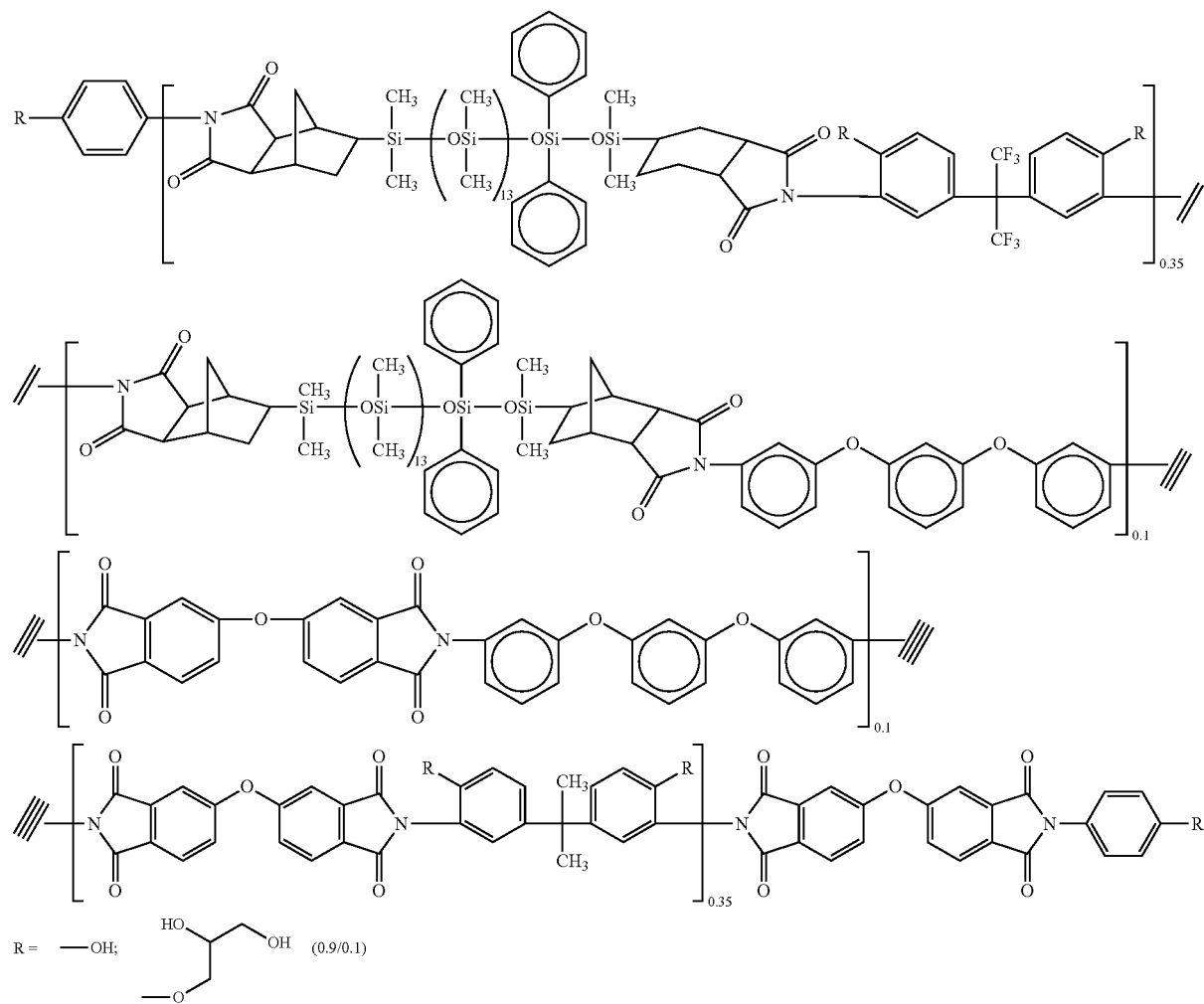

While the present invention has been described in detail and witht, reference to specific embodiments thereof, it will be apparent to one skilled in the art that various changes and modifications can be made therein without departing from the scope thereof.

This application is based on Japanese patent application No. 2009-227159 filed Sep. 30, 2009, the entire contents thereof being hereby incorporated by reference.

What is claimed is:

1. A polyimidesilicone having a primary alcoholic hydroxyl group, which polyimidesilicone is represented by the following general formula (1):

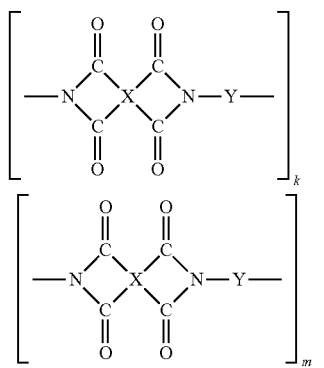

wherein
k and m are each a positive integer, in which k and m satisfy a relation of $0.01 \leq k/(k+m) < 1$;
X is a tetravalent organic group represented by the following general formula (2):

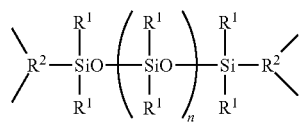

wherein $R^1$'s are each independently a monovalent hydrocarbon group having 1 to 8 carbon atoms, $R^2$'s are each independently a trivalent organic group, and n is a numeral of 1 to 120 on average;
Y's are each a divalent organic group and at least a part thereof is represented by the following general formula (3):

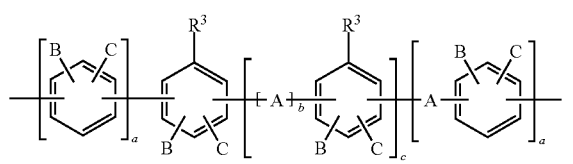

wherein A('s) is/are each a divalent organic group selected from:
—$CH_2$—, —O—, —$SO_2$—, —CONH—,

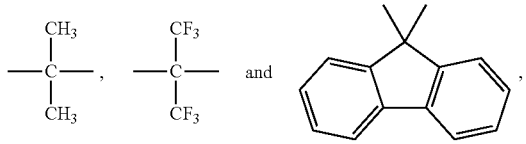

which may be the same as or different from each other, B('s) and C('s) are each an alkyl group having 1 to 4 carbon atoms or a hydrogen atom, and may be the same as or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one $R^3$ is an organic group containing a primary alcoholic hydroxyl group; and W is a tetravalent organic group other than X, wherein said polyimidesilicone has an OH value of 20 to 200 KOH mg/g.

2. The polyimidesilicone according to claim 1, which is a polyimidesilicone represented by the following general formula (1-1):

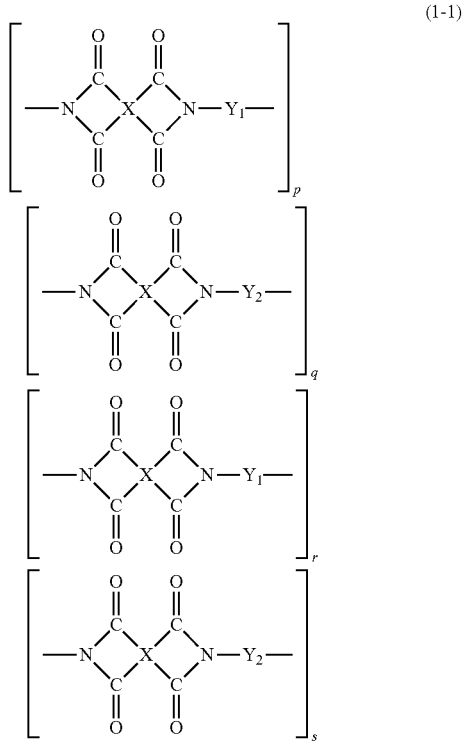

wherein
X and W are the same as above;
$Y_1$'s are each a divalent organic group represented by the general formula (3) and $Y_2$'s are each a divalent organic group other than the group represented by the general formula (3); and
p and r are each a positive integer, and q and s are each 0 or a positive integer, in which p, q, r and s satisfy relations of p+q=k and r+s=m (wherein k and m are the same as above).

3. The polyimidesilicone according to claim 1, wherein in the general formula (3), at least one of $R^3$'s is a monovalent group selected from —OH, —OCH$_2$CH(OH)CH$_2$OH and —OCH(CH$_2$OH)CH$_2$OH.

4. The polyimidesilicone according to claim 1, wherein in the general formula (1), W is one of tetravalent organic groups represented by the following formulae:

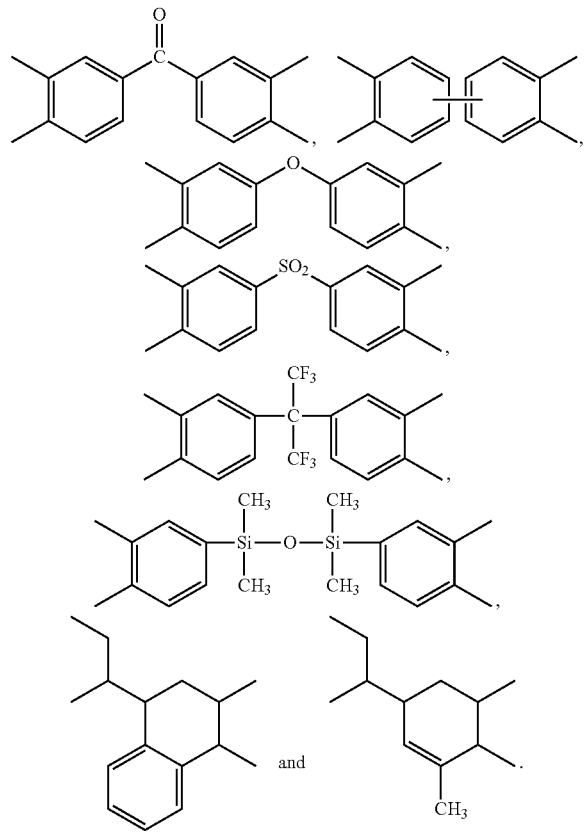

5. The polyimidesilicone according to claim 2, wherein $Y_2$'s are at least one selected from
a divalent organic group represented by the following general formula (4):

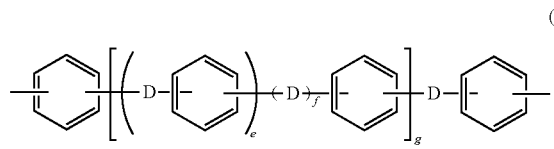

(4)

wherein D('s) is/are each independently any of the following divalent organic groups:
—CH$_2$—, —O—, —SO$_2$—, —CONH—,

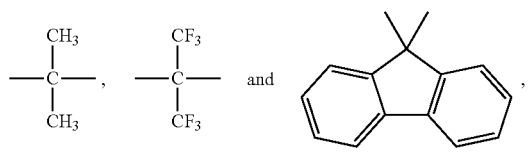

and
e and f are each independently 0 or 1 and g is 0 or 1; and
a divalent organic group represented by the following general formula (5)

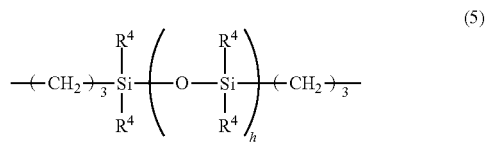

(5)

wherein $R^4$'s are each independently a monovalent hydrocarbon group having 1 to 8 carbon atoms and h is an integer of 1 to 80.

6. The polyimidesilicone according to claim 1, which has a phenol group, a thiol group or a carboxyl group at a terminal end thereof.

7. A process for producing a polyimidesilicone having a primary alcoholic hydroxyl group, which polyimidesilicone is represented by the following general formula (1):

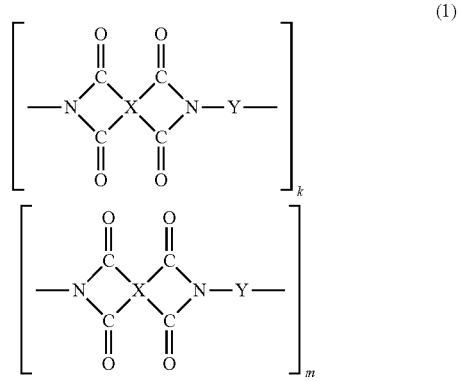

(1)

wherein
k and m are each a positive integer, in which k and m satisfy a relation of $0.01 \leq k/(k+m) < 1$,
X is a tetravalent organic group represented by the following general formula (2):

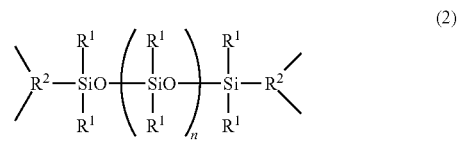

(2)

wherein $R^1$'s are each independently a monovalent hydrocarbon group having 1 to 8 carbon atoms, $R^2$'s are each independently a trivalent organic group, and n is a numeral of 1 to 120 on average,
Y's each are a divalent organic group and at least a part thereof is represented by the following general formula (3):

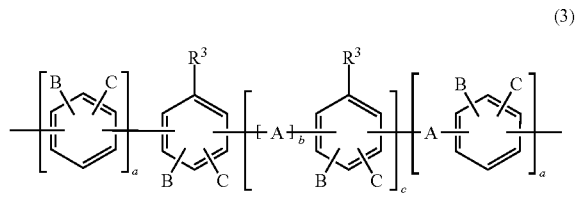

(3)

wherein A('s) is/are each a divalent organic group selected from the following groups:

—CH₂—, —O—, —SO₂—, —CONH—,

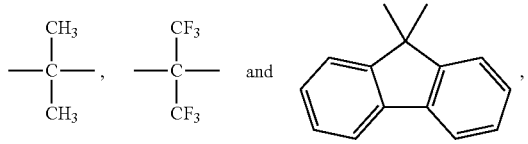

which may be the same as or different from each other, B('s) and C('s) are each an alkyl group having 1 to 4 carbon atoms or a hydrogen atom, and may be the same as or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one $R^3$ is an organic group containing a primary alcoholic hydroxyl group, and W is a tetravalent organic group other than X, wherein said polyimidesilicone has an OH value of 20 to 200 KOH mg/g, the method comprising:

reacting a diamine having a phenolic hydroxyl group with an acid anhydride-modified silicone, an acid dianhydride, and, if necessary, a diamine having no phenolic hydroxyl group and no carboxyl group to obtain a polyamic acid; then subjecting the polyamic acid to a dehydrative ring-closure reaction to obtain a polyimide having a phenolic hydroxyl group represented by the following general formula (6):

(6)

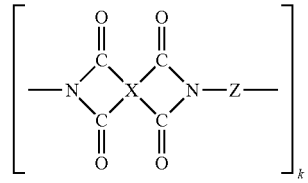

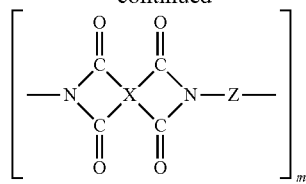

wherein X, W, k, and m are the same as above; and Z's each are a divalent organic group and at least a part thereof is a divalent organic group represented by the following general formula (7):

(7)

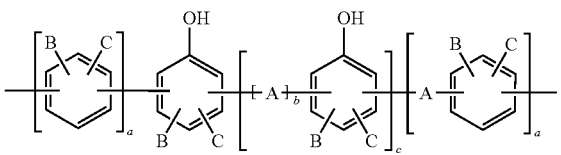

wherein A('s) is/are each a divalent organic group selected from the following groups:

—CH₂—, —O—, —SO₂—, —CONH—,

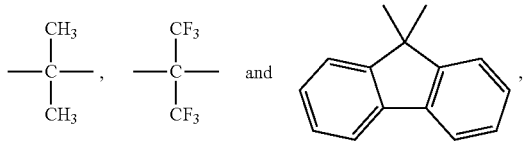

which may be the same as or different from each other, B('s) and C('s) are each an alkyl group having 1 to 4 carbon atoms or a hydrogen atom, and may be the same as or different from each other, a is 0 or 1, b is 0 or 1, and c is an integer of 0 to 10; and subsequently subjecting the polyimide to a reaction with glycidol, and further optionally subjecting the polyimide to a reaction with an acid anhydride.

* * * * *